United States Patent [19]

Braathen et al.

[11] Patent Number: 5,003,270
[45] Date of Patent: Mar. 26, 1991

[54] RF POWER-CONTROL CIRCUIT

[75] Inventors: Russell Braathen; Ronald Green, both of Calgary, Canada

[73] Assignee: NovAtel Communications Ltd., Alberta, Canada

[21] Appl. No.: 336,816

[22] Filed: Apr. 12, 1989

Related U.S. Application Data

[63] Continuation-in-part of Ser. No. 208,411, Jun. 17, 1988, Pat. No. 4,952,886.

[51] Int. Cl.⁵ .............................................. H03G 3/30
[52] U.S. Cl. ...................................... 330/279; 330/289
[58] Field of Search .............. 330/129, 138, 141, 149, 330/279, 281, 285, 289; 332/159, 162; 455/108, 126

[56] References Cited

U.S. PATENT DOCUMENTS 4,013,961  3/1977  Colebourn ..................... 455/126 X
4,639,938  1/1987  Kennett ......................... 330/149 X

FOREIGN PATENT DOCUMENTS 0039469  3/1980  Japan ............................... 332/37 D

*Primary Examiner*—Steven Mottola
*Attorney, Agent, or Firm*—Nutter, McClennen & Fish

[57] ABSTRACT

An improved circuit for controlling the output power level of a radio frequency (RF) amplifier is disclosed. The circuit samples the output of an RF amplifier. The sample is amplitude modulated at a preselected modulation frequency and is passed to a detector. In repsonse to the amplitude modulated signal, the detector produces a signal whose amplitude is indicative of the RF amplifier's output power and whose frequency is the modulation frequency. The amplitude of the signal produced by the detector is then compared to a reference amplitude and the difference (error signal) is used to control the gain of the RF amplifier.

4 Claims, 1 Drawing Sheet

RF POWER-CONTROL CIRCUIT

CROSS REFERENCE TO RELATED PATENT APPLICATIONS

This application is a continuation-in-part of prior pending application Ser. No. 07/208,411, filed June 17, 1988, now U.S. Pat. No. 4,952,886.

FIELD OF THE INVENTION

This invention relates generally to the control of the output of an RF amplifier, and more specifically, to a control circuit for accurately regulating the output power over a wide range of temperatures.

DESCRIPTION OF THE PRIOR ART

In certain applications it is desirable to maintain close control of the output power of an RF amplifier. For example, in cellular telephone systems the RF output of each subscriber unit must be controlled within specified tolerances over a temperature range corresponding to tropical conditions at one extreme and arctic conditions at the other.

Control of the output power amplifier is accomplished through a feedback loop. Typically, a portion of the output of the RF amplifier is applied as an input signal for a detector which, in turn, provides a power-indicating signal whose level corresponds to the RF output power. This signal is compared with a reference and the difference between the two is applied to the RF amplifier so as to change the amplifier's gain and minimize the magnitude of the difference.

The detector is typically a semiconductor diode which has a forward voltage drop that is dependent upon temperature. Moreover, the application of RF power to a diode will itself cause the temperature to change and therefore change the forward voltage drop. Consequently, as the temperature varies, the level of the power-indicating signal varies. This, in turn, causes the output of the RF amplifier to change even though the reference is held constant.

There are several methods of avoiding temperature-caused variation in RF output power. One method is to use a second diode whose characteristics match those of the detector diode and which is subjected to the same temperature. This second diode is connected in such a way as to reduce the temperature variations in the signal from the detector diode, an example being described in U.S. Pat. No. 4,523,155. However, the selection of diodes having matching characteristics is a relatively expensive procedure. Moreover, there is a practical limit on the extent to which the characteristics of the diodes can be matched and to which the diodes can be exposed to the same ambient temperature in the presence of thermal gradients caused by other components in the system.

In a case where the transmitter output level can be selectively varied over several orders of magnitude, for example in a cellular telephone, the temperature-variant forward voltage drop of the detector diode may be small compared to the detector input signal level, when high RF output power is being transmitted. The effect of temperature changes on the forward drop will be proportionally small and voltage drop fluctuations will therefore have little effect on the power-indicating signal generated by the detector. Alternatively, when low RF output power is being transmitted the forward voltage drop can be significant when compared with the detector input signal. Temperature variations in the voltage drop will therefore materially change the power-indicating signal.

Another method of coping with temperature variations makes use of this distinction. It compresses the dynamic range of the detector input signal by logarithmically amplifying the signal. By picking an appropriate amplification, the detector input signal can thus be made large compared with voltage drop across the detector diode for all power levels to be transmitted by the unit. Therefore, the temperature-caused variations in the voltage drop will have a small effect on the power-indicating signal. An example of this method is described in U.S. Pat. No. 4,602,218. However, this method does not provide as precise control as diode matching.

Another temperature-related problem is the offset in the amplifier that is used to amplify the power-indicating signal. The temperature-related changes in this offset will, uncompensated, also cause undesirable changes in the output amplifier.

SUMMARY OF THE INVENTION

In a circuit embodying the invention, a power amplifier's output is sampled as the RF input to the detector is amplitude modulated at a selected rate. The detector output is thus essentially a lower frequency signal whose amplitude corresponds to the amplitude of the RF signal to the detector and whose frequency is the modulation frequency. The amplitude of the lower frequency wave corresponds to the amplitude of the detector input signal and thus, to the RF amplifier output power. The lower frequency signal amplitude is compared to a reference to provide an error signal which is proportional to the difference between the lower frequency waveform amplitude and the reference. This error signal is then used to control the gain of the RF amplifier.

The amplitude of the lower frequency signal is independent of the quiescent voltage drop across the detector diode. While the amplitude is dependent upon the rectification efficiency of the diode, this effect is only lightly temperature dependent. Thus, the gain of the RF amplifier can be controlled with very little effect from temperature changes.

Switching the detector input signal on and off is a form of amplitude modulation with a square-wave modulation signal and, in fact, it is the preferred modulation arrangement for ease of implementation. However, other amplitude modulation arrangements can be used without departing from the scope of the invention. That is, in any such arrangement the detector rectifies its modulated RF input signal and its output is thus a modulation signal whose amplitude is substantially independent of the detector voltage drop. It should be noted that the modulation percentage should be essentially constant.

The amplitude of the low frequency signal may be determined after amplification. Since the amplitude of the signal is independent of any offset introduced by the amplifier, the temperature effect on the offset is removed.

BRIEF DESCRIPTION OF THE DRAWINGS

This invention is pointed out with particularity in the appended claims. The above and further advantages of this invention may be better understood by referring to the following description taken in conjunction with the accompanying drawing, the schematic diagram of the circuit constructed in accordance with the invention.

DETAILED DESCRIPTION OF AN ILLUSTRATIVE EMBODIMENT

Figure 1:
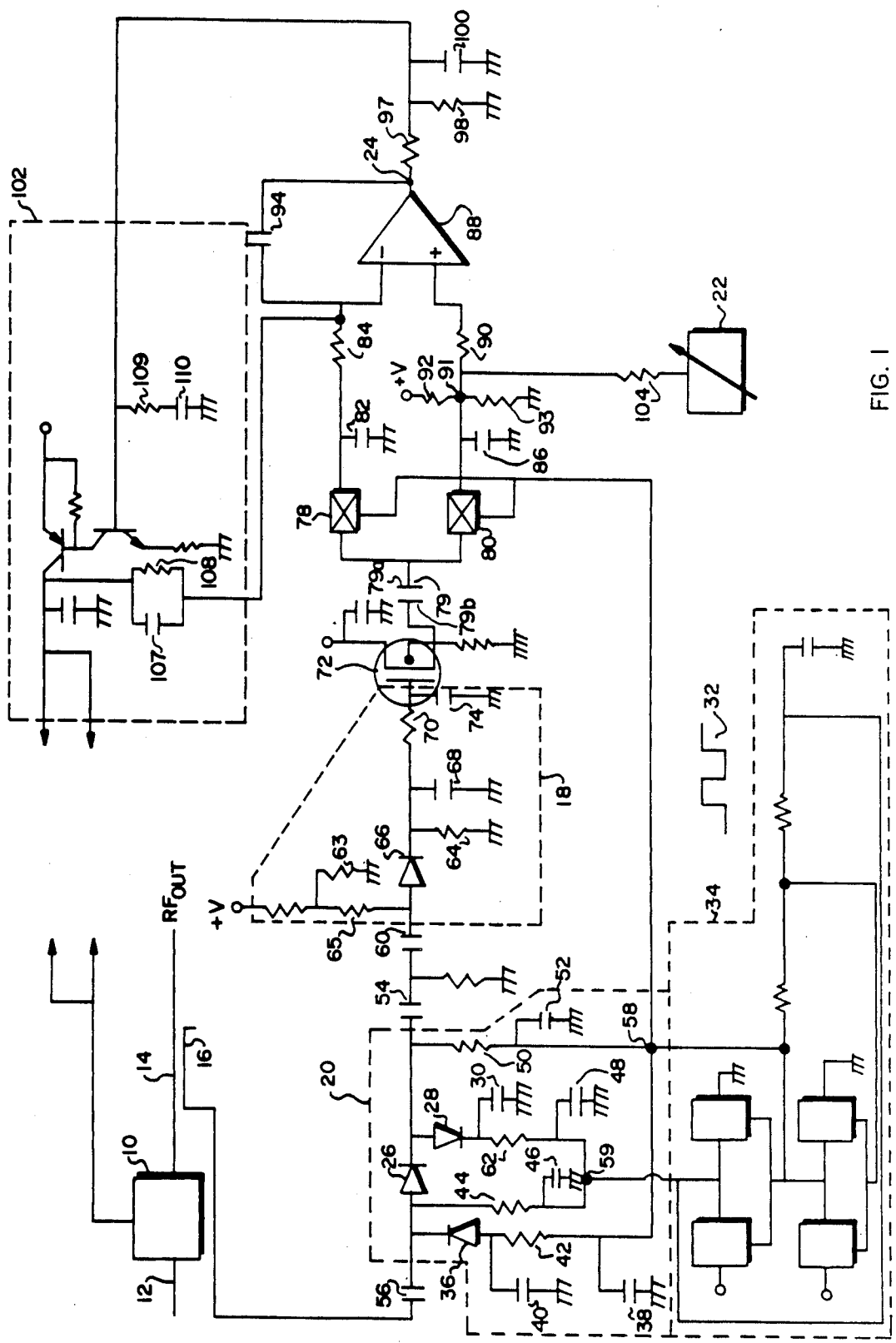

As shown in the drawing a controlled RF amplifier unit incorporating the invention includes a controllable RF amplifier 10 that amplifies an RF signal at an input terminal 12 and provides an output at a terminal 14. A portion of the RF output is extracted by a directional coupler 16 and applied as an input signal to a detector 18 through a switch 20. The output of the detector 18 is compared with a variable reference from a reference source 22 and the resulting difference or error signal at a terminal 24 is applied back to RF amplifier 10 to control the gain thereof.

The switch 20 consists primarily of a set of PIN diodes 26, 28 and 36. The diode 26 is connected in series in the signal path from the coupler 16 to the detector 18, through D.C. blocking capacitors 54, 56 and 60. The diodes 28 and 36 are connected in shunt. To turn the switch 20 on, the diode 26 is turned on and the diodes 28 and 36 are turned off, thus providing a signal-conducting path from the directional coupler 16 to the detector 18. To turn off the switch 20, diode 26 is turned off and diodes 28 and 36 are turned on. This breaks the path between the coupler 16 and the detector 18.

The switch 20 is periodically turned on and off in response to a switching signal 32 produced by a generator 34. This signal, which alternates between zero and a positive voltage with respect to ground, is applied to the switching node 59 and, in inverted form, to switching node 58.

More specifically, when the switching signal is positive, node 59 is positive and node 58 is at ground. This causes diode 26 to be forward biased by virtue of the conduction path from node 59 through resistors 44 and 50 to node 58. Diode 36 is reversed biased by virtue of the conduction path from node 59 through resistors 44 and 42 to node 58. Similarly, diode 28 is reversed biased by virtue of the conduction path from node 59 through resistors 62 and 50 to node 58.

When the switching signal becomes zero, one half-cycle later, node 59 is at ground and node 58 is positive. This causes diode 26 to be reverse biased by virtue of the previously described conduction path between nodes 58 and 59 and prevents the detector input signal from reaching the detector 18.

At the same time diode 28 is forward biased by virtue of the conduction path from node 58 through resistors 50 and 62 to node 59. With diode 28 forward biased, capacitor 30 acts to cancel the impedance of diode 28 so as to shunt to ground any RF signal which leaks through reverse-biased diode 26. Resistor 62 and capacitor 48 act as a filter to prevent any potentials appearing at the junction of diode 28 and capacitor 30 from propagating through the circuit. Similarly, when node 58 is positive, diode 36 is forward biased by virtue of the conduction path through resistors 42 and 44 to node 59. Capacitor 40 is present to cancel the impedance of the leads of diode 36 so that any RF signal that is present when diode 36 is conducting is brought to ground. Resistor 42 and capacitor 38 act as a filter to prevent any potential developed at the junction between diode 36 and capacitor 40 from propagating through the rest of the circuit.

The output of the switch 20 is a square-wave-modulated RF signal whose modulation corresponds to the modulation signal 32. That is, it is a square-wave-modulated RF signal whose frequency is the frequency of the switching signal and whose amplitude is a measure of the power in the RF output signal.

Detector 18 includes a diode 66 that is forward biased by the supply voltage (V+), applied through resistors 63, 65 and 64 to bring the diode into an operating region in which it is capable of detecting small input signals. The signal passed by the diode 66 is filtered by a resistor-capacitor network of capacitors 68 and 74 and resistor 70 to remove its RF content. The resulting signal is substantially a replica of the modulation, level-shifted or offset by the amount of the bias of the diode 66.

This power-indicating signal is applied to the gate terminal of a FET 72 connected as an amplifier. The output of the FET 72 is applied through a coupling capacitor 79, to remove the DC component, to two switches 78 and 80, which are alternately and oppositely turned on and off by the switching signal 32. The offset introduced in the detector 18 and the FET 72 is removed by the capacitor 79. The switches 78 and 80 are preferably low-offset devices such as CMOS switches and they therefore introduce negligible offset to the signals passed by them.

The switch 78 connects the capacitor 79 to a shunt capacitor 82 and, through a resistor 84, to the inverting input terminal of an operational amplifier 88. The non-inverting input terminal of the amplifier is connected through a resistor 104 to the variable reference voltage source 22. The same terminal is connected, by way of a resistor 90, to the junction 91 of a pair of resistors 92 and 93 and also to the switch 80. The resistors 92 and 93 serve as a voltage divider for the voltage provided by the supply voltage V+. A shunt capacitor 86 maintains a steady bias voltage, $V_B$, at the junction 91. This bias voltage is sufficient to maintain the amplifier 88 and a two-stage driver amplifier 102 in the linear regions of their operating characteristics.

The output of the amplifier 88 is passed through a filter comprising resistors 97 and 98 and a capacitor 100 to the driver amplifier 102. The output of the amplifier 102, in turn, is applied to the power-control terminal of the RF amplifier 10. Feedback for the amplifiers 88 and 102 is provided by a capacitor 94 and by the parallel combination of a capacitor 107 and a resistor 108, as shown in the drawing. Further loop compensation is provided by a resistor 109 and capacitor 110.

With the foregoing arrangement, the output of the reference source 22 provides a corresponding voltage $V_R$ at the non-inverting terminal of the amplifier 88 and a reduced voltage component at the capacitor 86. For the purposes of this description, this component can be considered negligible.

Operation of the comparison circuit is as follows. Assume first that the output of the switching signal generator 34 at node 59 is at the zero-volt level. A positive control voltage from the node 58 is thus applied to the switches 78 and 80. The switch 80 is therefore on and the switch 78, with its inverting control terminal, is off. The bias voltage $V_B$ on the capacitor 86 is thus applied to the terminal 79a of the capacitor 79. The switch 20 is off at this time and the voltage at the capacitor terminal 79b is $V_{OS}$, the offset resulting from operation of the detector 68 and the FET 72.

When the switching signal becomes positive, it turns the switch 80 off and the switch 78 on. Also the switch 20 is on. Accordingly, the voltage at the capacitor terminal 79b increases by $V_S$, in proportion to the output of the RF amplifier 10. The voltage at the capacitor terminal 79a also increases by this amount to $V_B+V_S$. This voltage, which is applied to the inverting terminal of the amplifier 88, is held substantially constant by the capacitor 82 during the next alternation of the output of the generator 34.

Accordingly, the difference voltage $V_D$ amplified by the amplifier 88 is $$V_D = V_R + V_B - (V_B + V_S) = V_R + V_B(c-1) - V_S$$

The control loop regulating the output of the RF amplifier 10 operates to maintain the voltage $V_S$ at a level corresponding to a value of zero for the difference voltage $V_O$. Thus the voltage $V_S$ and the output power from which it is derived track changes in the reference voltage $V_R$ provided by the reference source 22.

The foregoing description has been limited to a specific embodiment of this invention. It will be apparent, however, that variations and modifications may be made to the invention, with the attainment of some or all of the advantages of the invention. For examples, detection may be accomplished through a device other than a diode, e.g. a bolometer. Further, synchronous rectification, as provided by the switches 78 and 80 and amplifier 88, would not be required if the signal were AC-amplified and its amplitude measured. Therefore, it is the object of the appended claims to cover all such variations and modifications as come within the true spirit and scope of the invention.

What is claimed as new and desired to be secured by Letters Patent of the United States is:

1. A circuit for controlling the output power level of a gain-controllable amplifier, said amplifier having an input for receiving a signal to be amplified, and an output for producing an amplified signal, said circuit comprising:

means for obtaining a sample of said amplified signal and amplitude modulating said sample with a modulation signal to produce a modulated signal;

means for recovering the modulation signal from the modulated signal and comparing the recovered signal with a reference to generate an error signal; and means, responsive to the error signal, for controlling the gain of said amplifier.

2. A circuit as in claim 1 wherein a variable reference source supplies said reference, thereby enabling the output power of the gain-controllable amplifier to be adjusted to a predetermined level.

3. A circuit as in claim 1 wherein said modulation signal comprises a square wave.

4. A circuit as in claim 1 wherein said modulation signal comprises a stepped wave.

* * * * *